United States Patent
Nakagawa et al.

(10) Patent No.: US 9,039,909 B2
(45) Date of Patent: May 26, 2015

(54) PLASMA ETCHING METHOD, SEMICONDUCTOR DEVICE MANUFACTURING METHOD AND COMPUTER-READABLE STORAGE MEDIUM

(75) Inventors: Akira Nakagawa, Kurokawa (JP); Yuji Otsuka, Kurokawa (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 195 days.

(21) Appl. No.: 13/405,539

(22) Filed: Feb. 27, 2012

(65) Prior Publication Data

US 2012/0220135 A1    Aug. 30, 2012

Related U.S. Application Data

(60) Provisional application No. 61/466,183, filed on Mar. 22, 2011.

(30) Foreign Application Priority Data

Feb. 28, 2011   (JP) ................ 2011-042501
Feb. 27, 2012   (JP) ................ 2012-039978

(51) Int. Cl.
    *B44C 1/22*        (2006.01)
    *H01L 21/311*     (2006.01)

(52) U.S. Cl.
    CPC .... *H01L 21/31116* (2013.01); *H01L 21/31144* (2013.01)

(58) Field of Classification Search
    None
    See application file for complete search history.

(56) References Cited

U.S. PATENT DOCUMENTS

| | | | |
|---|---|---|---|
| 6,916,746 B1 * | 7/2005 | Hudson et al. | 438/706 |
| 2008/0012058 A1 * | 1/2008 | Nobuto | 257/306 |
| 2009/0176375 A1 * | 7/2009 | Benson et al. | 438/719 |
| 2009/0311842 A1 * | 12/2009 | Kuo | 438/396 |

FOREIGN PATENT DOCUMENTS

JP     2006-523030 A     10/2006

* cited by examiner

*Primary Examiner* — Binh X Tran
*Assistant Examiner* — David Cathey, Jr.
(74) *Attorney, Agent, or Firm* — Pearne & Gordon LLP

(57) ABSTRACT

There is provided a plasma etching method for forming a hole in a silicon oxide film formed on an etching stopper layer. The plasma etching method includes a main etching process for etching the silicon oxide film; and an etching process that is performed when at least a part of the etching stopper layer is exposed after the main etching process. The etching process includes a first etching process using a gaseous mixture of a $C_4F_6$ gas, an Ar gas and an $O_2$ gas as the processing gas; and a second etching process using a gaseous mixture of a $C_4F_8$ gas, an Ar gas and an $O_2$ gas or a gaseous mixture of a $C_3F_8$ gas, an Ar gas and an $O_2$ gas as the processing gas. The first etching process and the second etching process are alternately performed plural times.

8 Claims, 6 Drawing Sheets

PLASMA ETCHING METHOD, SEMICONDUCTOR DEVICE MANUFACTURING METHOD AND COMPUTER-READABLE STORAGE MEDIUM

CROSS-REFERENCE TO RELATED APPLICATION

This application claims the benefit of Japanese Patent Application Nos. 2011-042501 and 2012-39978 filed on Feb. 28, 2011 and Feb. 27, 2012, respectively, and U.S. Provisional Application Ser. No. 61/466,183 filed on Mar. 22, 2011, the entire disclosures of which are incorporated herein by reference.

FIELD OF THE INVENTION

The present disclosure relates to a plasma etching method, a semiconductor device manufacturing method and a computer-readable storage medium.

BACKGROUND OF THE INVENTION

Conventionally, in a semiconductor device manufacturing process, there has been employed a plasma etching method for etching a substrate (e.g., a semiconductor wafer) in a processing chamber by using plasma. By way of example, in the semiconductor device manufacturing process, the plasma etching method has been used to form a contact hole in a silicon dioxide film. When forming a contact hole, there has been a demand for a HARC (High Aspect Ratio Contact). However, it has been difficult to form a contact hole having a high aspect ratio while maintaining a vertical sidewall shape thereof.

As for such a plasma etching method, there is known a technique for forming a contact hole while maintaining a vertical sidewall shape thereof by alternately repeating a period of forming a protection film by using plasma of a gas having a high deposition property and a period of etching the substrate by using plasma of a gas having a low deposition property (see, for example, Patent Document 1).

Patent Document 1: Published Japanese Translation of PCT Patent Application No. 2006-523030

As stated above, in the semiconductor device manufacturing process, although a contact hole having a high aspect ratio is required, it has been difficult to form a contact hole having a high aspect ratio by a plasma etching while maintaining a vertical sidewall shape thereof.

Further, the present inventors have found out that the following problems are generated when a contact hole having a high aspect ratio is formed. That is, if an overetching process is performed after a main etching process under the same conduction for the main etching process suitable for forming a contact hole having a high aspect ratio, a minimum bar (i.e., a thickness of a thinnest portion of a partition wall between adjacent holes) is found to be decreased rapidly in the overetching process (around an etching time of about 680 seconds) as compared to the main etching process, as shown in a graph of FIG. 8. In the graph, a vertical axis represents the minimum bar and a hole depth, and a horizontal axis represents an etching time. In order to prevent the rapid decrease of the minimum bar, if the overetching process is performed under an etching condition where a greater amount of deposits is generated, since a top opening diameter (Top CD) of a hole is small, the hole may be covered with the deposits.

BRIEF SUMMARY OF THE INVENTION

In view of the foregoing, illustrative embodiments provide a semiconductor device manufacturing method and a plasma etching method capable of forming a contact hole having a high aspect ratio while suppressing a rapid decrease of a minimum bar in an overetching process. Further, the illustrative embodiments also provide a computer-readable storage medium.

In accordance with one aspect of an illustrative embodiment, there is provided a plasma etching method for forming, via a mask layer, a hole in a silicon oxide film formed on an etching stopper layer of a processing target substrate accommodated in a processing chamber by using plasma generated from a processing gas introduced into the processing chamber. The plasma etching method includes a main etching process for etching the silicon oxide film; and an etching process that is performed when at least a part of the etching stopper layer is exposed after the main etching process. Further, the etching process that is performed when at least the part of the etching stopper layer is exposed may include a first etching process using a gaseous mixture of a $C_4F_6$ gas, an Ar gas and an $O_2$ gas as the processing gas; and a second etching process using a gaseous mixture of a $C_4F_8$ gas, an Ar gas and an $O_2$ gas or a gaseous mixture of a $C_3F_8$ gas, an Ar gas and an $O_2$ gas as the processing gas. Furthermore, the first etching process and the second etching process may be alternately performed plural times.

In accordance with another aspect of an illustrative embodiment, there is provided a semiconductor device manufacturing method including a plasma etching process for forming, via a mask layer, a hole in a silicon oxide film formed on an etching stopper layer of a processing target substrate accommodated in a processing chamber by using plasma generated from a processing gas introduced into the processing chamber. The plasma etching process may include a main etching process for etching the silicon oxide film; and an etching process that is performed when at least a part of the etching stopper layer is exposed after the main etching process. Further, the etching process that is performed when at least the part of the etching stopper layer is exposed may include a first etching process using a gaseous mixture of a $C_4F_6$ gas, an Ar gas and an $O_2$ gas as the processing gas; and a second etching process using a gaseous mixture of a $C_4F_8$ gas, an Ar gas and an $O_2$ gas or a gaseous mixture of a $C_3F_8$ gas, an Ar gas and an $O_2$ gas as the processing gas. Furthermore, the first etching process and the second etching process may be alternately performed plural times.

In accordance with an illustrative embodiment, it is possible to provide a semiconductor device manufacturing method and a plasma etching method capable of forming a contact hole having a high aspect ratio while suppressing a rapid decrease of a minimum bar in an overetching process. Further, it is also possible to provide a computer-readable storage medium.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
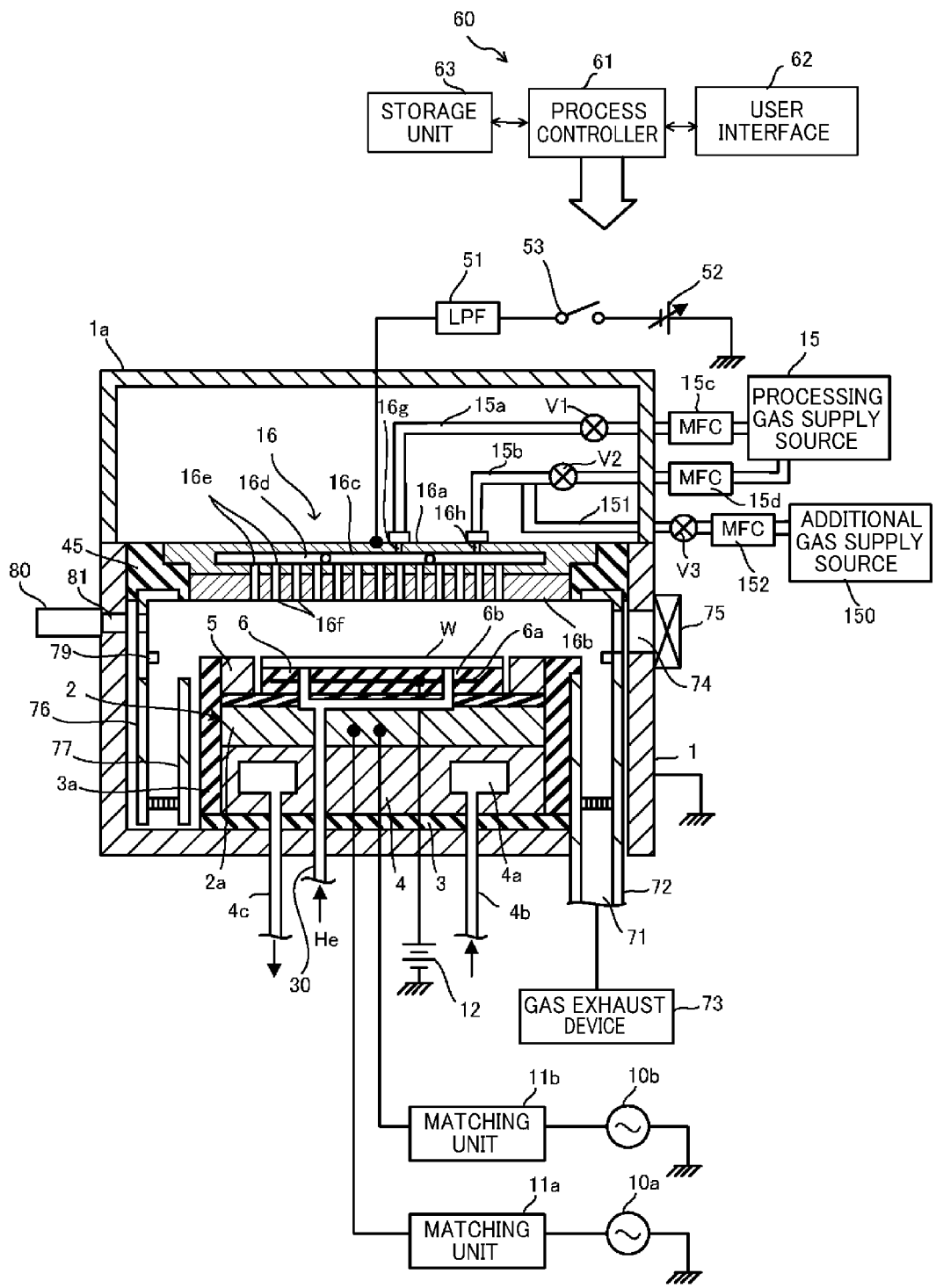
FIG. 1 is a schematic configuration view of a plasma etching apparatus to be used in an illustrative embodiment.

Hereinafter, illustrative embodiments will be described with reference to the accompanying drawings. FIG. 1 illustrates a configuration of a plasma etching apparatus in accordance with an illustrative embodiment. First, the configuration of the plasma etching apparatus will be explained.

The plasma etching apparatus includes a processing chamber 1 that is airtightly sealed and electrically grounded. The processing chamber 1 has a cylindrical shape and is made of, but not limited to, aluminum having thereon an anodic oxidized film. A mounting table 2 for horizontally mounting thereon a wafer W as a processing target substrate is provided in the processing chamber 1.

The mounting table 2 has a base 2a made of a conductive metal such as aluminum, and serves as a lower electrode. The mounting table 2 is supported on a conductive support 4 on an insulating plate 3. Further, a focus ring 5 made of, e.g., single crystalline silicon is placed at an upper periphery of the mounting table 2. Further, a cylindrical inner wall member 3a made of, e.g., quartz is disposed to surround the mounting table 2 and the support 4.

The base 2a of the mounting table 2 is connected with a first high frequency power supply 10a via a first matching unit 11a and also connected with a second high frequency power supply 10b via a second matching unit 11b. The first high frequency power supply 10a is used for plasma generation, and a high frequency power of a certain frequency (equal to or higher than about 27 MHz, e.g., about 40 MHz) is supplied to the base 2a of the mounting table 2 from the first high frequency power supply 10a. The second high frequency power supply 10b is used for ion attraction (bias), and a high frequency power of a certain frequency (equal to or lower than about 13.56 MHz, e.g., about 3.2 MHz) lower than the frequency of the first high frequency power supply 10a is supplied to the base 2a of the mounting table 2 from the second high frequency power supply 10b. Further, a shower head 16 serving as an upper electrode is disposed above the mounting table 2 so as to face the mounting table 2 in parallel. The shower head 16 and the mounting table 2 serve as a pair of electrodes (upper electrode and lower electrode, respectively).

An electrostatic chuck 6 for electrostatically attracting and holding the semiconductor wafer W is provided on a top surface of the mounting table 2. The electrostatic chuck 6 includes an electrode 6a embedded in an insulator 6b, and the electrode 6a is connected with a DC power supply 12. The semiconductor wafer W is attracted to and held on the electrostatic chuck 6 by a Coulomb force generated by applying a DC voltage to the electrode 6a from the DC power supply 12.

A coolant path 4a is formed within the support 4, and a coolant inlet pipe 4b and a coolant outlet pipe 4c are connected to the coolant path 4a. By circulating a coolant such as cooling water through the coolant path 4a, the support 4 and the mounting table 2 can be controlled to have a certain temperature. Further, a backside gas supply pipe 30 for supplying a cold heat transfer gas (backside gas) such as a helium gas toward a rear side of the semiconductor wafer W is formed through the mounting table 2. This backside gas supply pipe 30 is connected with a non-illustrated backside gas supply source. With this configuration, the semiconductor wafer W held on the top surface of the mounting table 2 by the electrostatic chuck 6 can be controlled to have a certain temperature.

The shower head 16 is provided at a ceiling wall of the processing chamber 1. The shower head 16 includes a main body 16a and a top plate 16b serving as an electrode plate. The shower head 16 is supported at a top portion of the processing chamber 1 via a supporting member 45. The main body 16a is made of a conductive material such as aluminum whose surface is anodically oxidized. The top plate 16b is detachably supported on a bottom surface of the main body 16a.

Gas diffusion spaces 16c and 16d are formed within the main body 16a, and a multiple number of gases through holes 16e are formed in a bottom portion of the main body 16a so as to be located under the gas diffusion spaces 16c and 16d. The gas diffusion space 16c is positioned at a central portion of the main body 16a, while the gas diffusion space 16d is positioned at a periphery portion thereof. Accordingly, it is possible to independently control a supply of a processing gas at the central portion of the main body 16a and a supply of the processing gas at the periphery portion thereof.

Further, gas inlet holes 16f are formed through the top plate 16b in a thickness direction thereof so as to be connected with the gas through holes 16e, respectively. With this configuration, a processing gas supplied into the gas diffusion spaces 16c and 16d is dispersed and introduced into the processing chamber 1 via the gas through holes 16e and the gas inlet holes 16f, as in a shower device. A non-illustrated pipe for circulating a coolant is provided in the main body 16a, and, thus, the shower head 16 can be cooled to a desired temperature during a plasma etching process.

The main body 16a is provided with two gas inlets 16g and 16h through which the processing gas is introduced into the gas diffusion spaces 16c and 16d, respectively. The gas inlets 16g and 16h are connected to one ends of gas supply pipes 15a and 15b, respectively, and the other ends of the gas supply pipes 15a and 15b are connected to a processing gas supply source 15 that supplies a processing gas for etching. A mass flow controller (MFC) 15c and an opening/closing valve V1 are provided at the gas supply pipe 15a in sequence from the upstream side. Further, a mass flow controller (MFC) 15d and an opening/closing valve V2 are provided at the gas supply pipe 15b in sequence from the upstream side.

The processing gas for plasma etching is supplied into the gas diffusion spaces 16c and 16d from the processing gas supply source 15 via the gas supply pipes 15a and 15b. Then, the processing gas is dispersed and supplied into the processing chamber 1 via the gas through holes 16e and the gas inlet holes 16f from the gas diffusion spaces 16c and 16d, as in a shower device.

The gas supply pipe 15b is connected to one end of an additional gas supply pipe 151, and the other end of the additional gas supply pipe 151 is connected to an additional gas supply source 150. A mass flow controller (MFC) 152 and an opening/closing valve V3 are provided at the additional gas supply pipe 151 in sequence from the upstream side. With this configuration, in addition to the processing gas supplied from the processing gas supply source 15, it is possible to supply an additional gas from the additional gas supply source 150 toward a periphery portion of the semiconductor wafer W through the gas diffusion space 16*d* formed at the periphery portion of the main body 16*a*.

A variable DC power supply 52 is electrically connected to the shower head 16 as the upper electrode via a low pass filter (LPF) 51. A power supply of the variable DC power supply 52 is on-off controlled by an on/off switch 53. A current and a voltage of the variable DC power supply 52 and an on/off operation of the on/off switch 53 are controlled by a control unit 60 to be described later. When plasma is generated in a processing space by applying the high frequency powers to the mounting table 2 from the first high frequency power supply 10*a* and the second high frequency power supply 10*b*, if necessary, the on/off switch 53 is turned on by the control unit 60, so that a certain DC voltage is applied to the shower head 16 serving as the upper electrode.

A cylindrical ground conductor 1*a* is extended upward from a sidewall of the processing chamber 1 to be located at a position higher than the shower head 16. The cylindrical ground conductor 1a has a ceiling wall at the top thereof.

A gas exhaust port 71 is formed in a bottom portion of the processing chamber 1, and a gas exhaust device 73 is connected to the gas exhaust port 71 via a gas exhaust pipe 72. The gas exhaust device 73 has a vacuum pump, and the inside of the processing chamber 1 can be depressurized to a certain vacuum level by operating the vacuum pump. Further, a loading/unloading port 74 for the semiconductor wafer W is formed in the sidewall of the processing chamber 1, and a gate valve 75 for opening and closing the loading/unloading port 74 is provided at the loading/unloading port 74.

Reference numerals 76 and 77 in FIG. 1 denote detachable deposition shields. The deposition shield 76 is provided along an inner wall surface of the processing chamber 1 so as to prevent etching byproducts (deposits) from adhering to the processing chamber 1. A conductive member (GND block) 79, which is DC-connected to the ground, is provided at the deposition shield 76 so as to be located at the substantially same height as that of the semiconductor wafer W. With this configuration, an abnormal electric discharge can be prevented.

The overall operation of the plasma etching apparatus configured as described above is controlled by the control unit 60. The control unit 60 includes a process controller 61, having a CPU, for controlling individual parts of the plasma etching apparatus; a user interface 62; and a storage unit 63.

The user interface 62 includes a keyboard through which a process manager inputs a command to manage the plasma etching apparatus; a display for visually displaying an operational status of the plasma etching apparatus; and so forth.

The storage unit 63 stores therein control programs (software) for implementing various processes performed in the plasma etching apparatus under the control of the process controller 61; and recipes including processing condition data and the like. In response to an instruction from the user interface 62 or the like, a necessary recipe is retrieved from the storage unit 63 and executed by the process controller 61, so that a desired process is performed in the plasma etching apparatus under the control of the process controller 61. The control programs and the recipes including the processing condition data can be read out from a computer-readable storage medium (e.g., a hard disk, a CD, a flexible disk, a semiconductor memory, or the like), or can be used on-line by being received from another apparatus through, e.g., a dedicated line, whenever necessary.

Further, an end-point detector (EPD) 80 is provided at the sidewall of the processing chamber 1. A change of plasma emission intensity in the processing space within the processing chamber 1 is detected through a window 81 provided at the sidewall of the processing chamber 1, so that an endpoint of the etching process can be detected.

Now, a sequence for performing a plasma etching on, e.g., a silicon dioxide film, which is formed on a semiconductor wafer W, in the plasma etching apparatus having the above-described configuration will be explained. First, the gate valve 75 is opened, and the semiconductor wafer W is loaded into the processing chamber 1 through the loading/unloading port 74 via a non-illustrated load lock chamber by a non-illustrated transfer robot, and the semiconductor wafer W is mounted on the mounting table 2. Then, the transfer robot is retreated from the processing chamber 1, and the gate valve 75 is closed. Subsequently, the processing chamber 1 is evacuated through the gas exhaust port 71 by the vacuum pump of the gas exhaust device 73.

When the inside of the processing chamber 1 reaches a desired vacuum level, a processing gas (etching gas) is supplied into the processing chamber 1 from the processing gas supply source 15, and the inside of the processing chamber 1 is maintained at a certain pressure. At this time, a supply of the processing gas from the processing gas supply source 15 can be independently controlled at a central portion of the semiconductor wafer W and a periphery portion thereof. Further, among the total supply amount of processing gas, a ratio between a supply amount to the central portion of the semiconductor wafer W and a supply amount to the periphery portion thereof can be controlled to a desired value. Moreover, when necessary, the additional gas may be supplied to the periphery portion of the semiconductor wafer W from the additional gas supply source 150.

In this state, a high frequency power having a frequency of, e.g., about 40 MHz is applied to the mounting table 2 from the first high frequency power supply 10*a*. Further, a high frequency (bias) power having a frequency of, e.g., about 3.2 MHz is applied to the mounting table 2 from the second high frequency power supply 10*b* so as to attract ions. At this time, a DC voltage is applied from the DC power supply 12 to the electrode 6*a* of the electrostatic chuck 6, so that the semiconductor wafer W is attracted to and held on the electrostatic chuck 6 by a Coulomb force.

As described above, by applying the high frequency powers to the mounting table 2 serving as the lower electrode, an electric field is formed between the shower head 16 serving as the upper electrode and the mounting table 2 serving as the lower electrode. Due to the electric field, an electric discharge is generated in the processing space in which the semiconductor wafer W is located. As a result, plasma of the processing gas is generated, and the silicon dioxide film formed on the semiconductor wafer W is etched by the plasma.

Further, as described above, by applying the DC voltage to the shower head 16 during the plasma process, the following effects can be achieved. Depending on processes to be performed, plasma having high electron density and low ion energy may be required. If the DC voltage is applied in such a case, energy of ions implanted into the semiconductor wafer W would be decreased, and electron density of the plasma would be increased. As a consequence, an etching rate of an etching target film on the semiconductor wafer W would be increased, whereas a sputtering rate of a film serving as a mask formed on the etching target film would be reduced. As a result, etching selectivity can be improved.

Upon the completion of the above-described etching process, the supplies of the high frequency powers, the DC voltage and the processing gas are stopped, and the semiconductor wafer W is unloaded from the processing chamber 1 in a reverse sequence to the above-described sequence.

Figure 2:
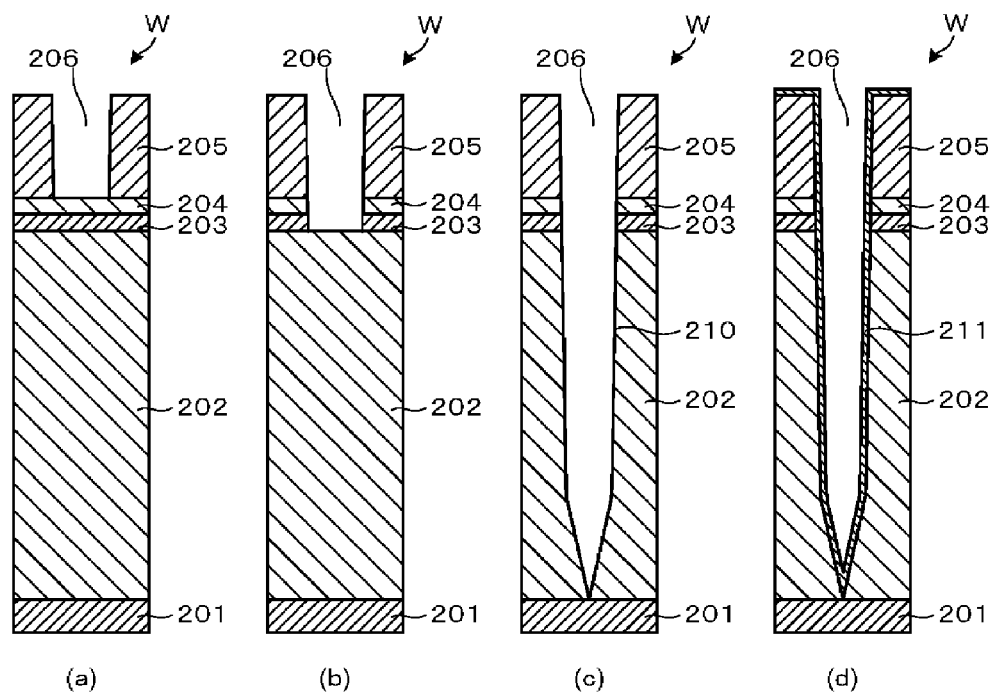
FIG. 2 is a diagram for describing a process sequence of a plasma etching method in accordance with the illustrative embodiment.
Figure 2:
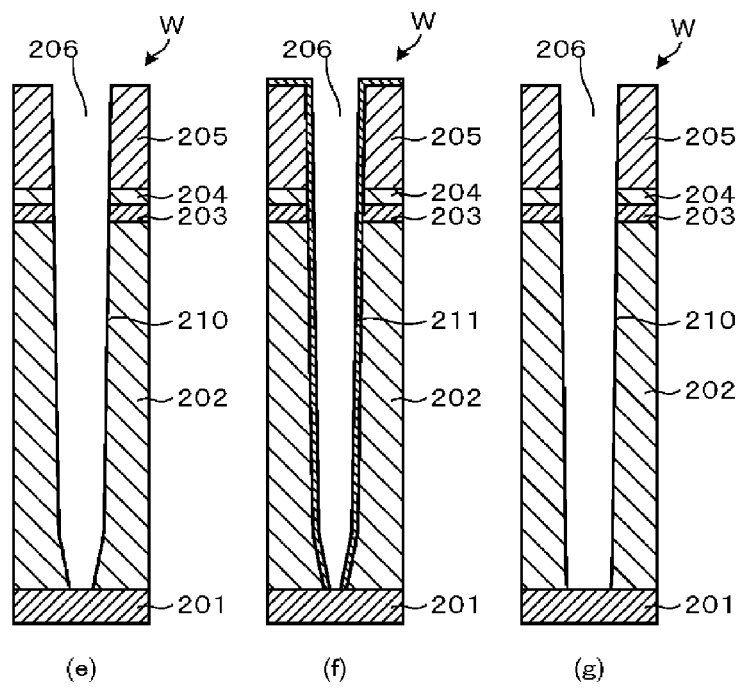
Figure 3:
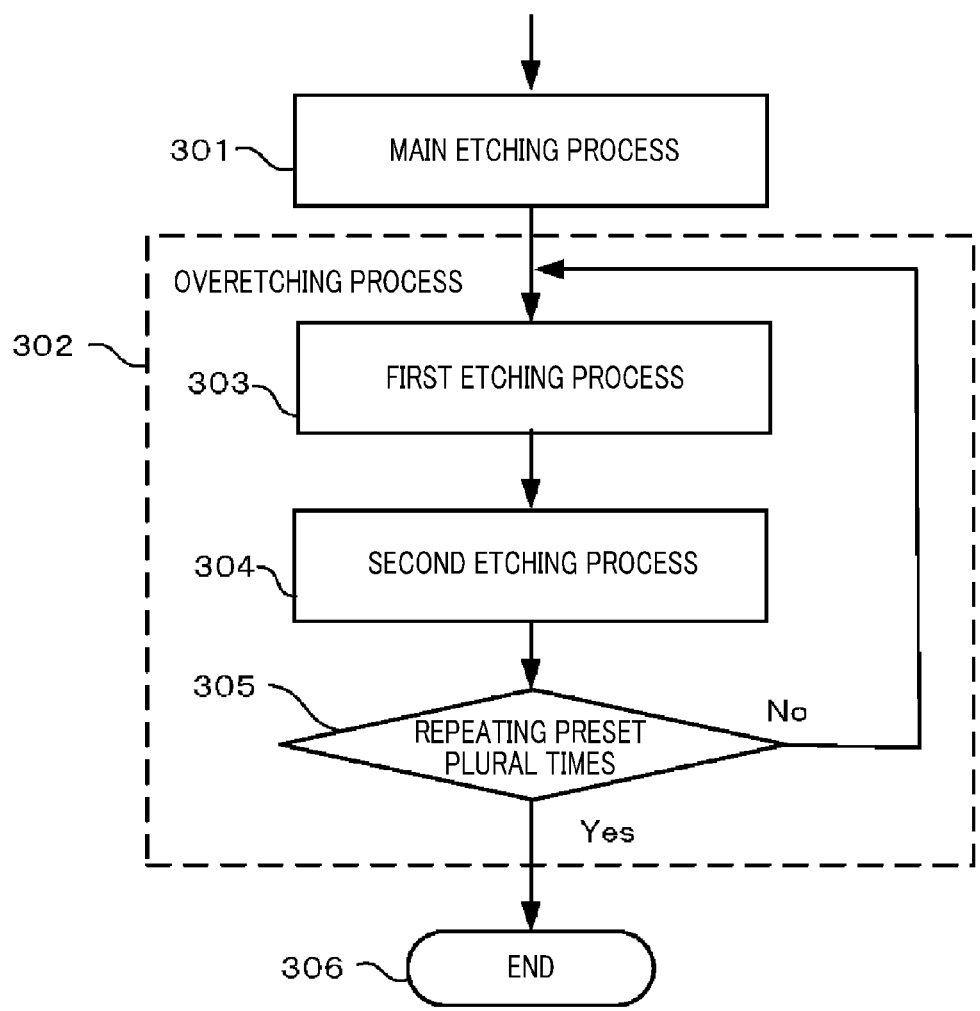
FIG. 3 is a flowchart for describing a process sequence of the plasma etching method in accordance with the illustrative embodiment.

Now, a plasma etching method in accordance with an illustrative embodiment will be described with reference to FIGS. 2 and 3. In the illustrative embodiment, a contact hole having a high aspect ratio is formed. FIG. 2 provides cross sectional views schematically illustrating a structure of a semiconductor wafer W. FIG. 3 is a flowchart for describing a plasma etching process.

As shown in FIG. 2(a), in the semiconductor wafer W, a silicon dioxide layer 202 (having a thickness of, e.g., about 2000 nm) is formed on a silicon nitride layer 201 (having a thickness of, e.g., about 30 nm) as an etching stopper layer. On the silicon dioxide layer 202 (having a thickness of, e.g., about 2000 nm), a silicon nitride layer 203 (having a thickness of, e.g., about 100 nm), a silicon dioxide layer 204 (having a thickness of, e.g., about 100 nm) and a polysilicon layer 205 (having a thickness of, e.g., about 500 nm) serving as a mask layer are formed in sequence from the bottom. A top opening diameter (Top CD) and a bottom opening diameter (Bottom CD) of an opening 206 formed in the polysilicon layer 205 are set to be, e.g., about 39 nm and about 30 nm, respectively. A gap between adjacent openings 206 is set to be about 40 nm.

From the state shown in FIG. 2(a), the silicon dioxide layer 204 and the silicon nitride layer 203 are etched in sequence, so that a state shown in FIG. 2(b) is obtained. Then, an etching process (hereinafter, referred to an "overetching process") for forming a hole 210 having a high aspect ratio by etching the silicon dioxide layer 202 is performed. The etching process for forming a hole 210 includes two processes: a main etching process (process 301 of FIG. 3) for etching the silicon dioxide layer 202 up to the vicinity of a bottom thereof and an overetching process (process 302 of FIG. 3) performed immediately before or after the silicon nitride layer 201 at the bottom of the silicon dioxide layer 202 is exposed.

The main etching process is performed to etch the silicon dioxide layer 202 up to the vicinity of the bottom thereof, so that a state shown in FIG. 2(c) is obtained. Then, the overetching process is performed. In this overetching process, a first etching process (process 303 of FIG. 3) and a second etching process (process 304 of FIG. 3) are alternately performed preset plural times (process 305 of FIG. 3). In the first etching process, a gaseous mixture of a $C_4F_6$ gas, an Ar gas and an $O_2$ gas is used as a processing gas. In the second etching process, a gaseous mixture of a $C_4F_8$ gas, an Ar gas and an $O_2$ gas or a gaseous mixture of a $C_3F_8$ gas, an Ar gas and an $O_2$ gas is used as a processing gas.

Under an etching condition of the first etching process, a great amount of deposits is generated, and a protection film 211 is formed on the hole 210, as shown in FIG. 2(d). Meanwhile, under an etching condition of the second etching process, a small amount of deposits are generated, and the protection film 211 formed on the hole 210 is etched to be removed and a bottom portion of the hole 210 is etched, as shown in FIG. 2(e). After the protection film 211 formed on the hole 210 is removed by the second etching process as shown in FIG. 2(e), the first etching process is performed again, so that a protection film 211 is formed on the hole 210, as depicted in FIG. 2(f).

After repeatedly performing the first etching process and the second etching process plural times, the second etching process is finally performed, so that a hole 210 having a high aspect ratio and reaching the silicon nitride layer 201 as the etching stopper layer is formed.

In the overetching process, in order to control the status of the protection film 211 more precisely, it may be desirable to set a time during which each of the first etching process and the second etching process is performed one time to be short. However, it takes about a few seconds to change the gas within the processing chamber 1. For this reason, by way of example, the time during which each of the first and second etching processes is performed one time may be set to be in the range from about several seconds to about several tens of seconds, e.g., about 3 seconds to about 15 seconds, desirably, and, more desirably, in the range from about 5 seconds to about 10 seconds. The overetching process is performed for, e.g., about 1 minute to several minutes. Accordingly, one cycle during which the first and second etching processes are performed one time is repeatedly conducted several times or several tens of times.

Figure 8:
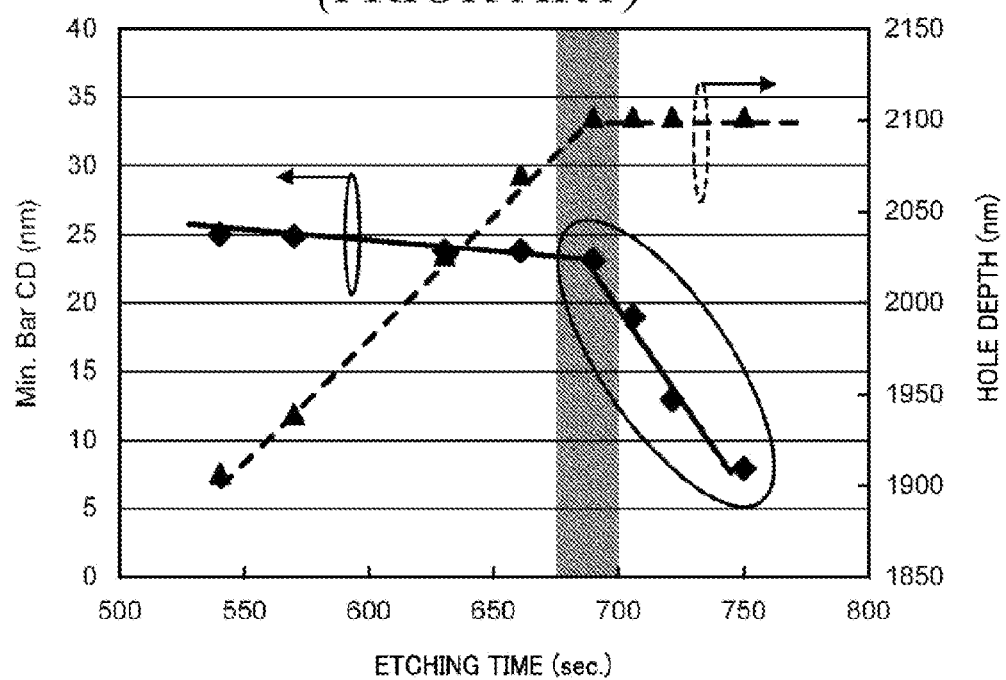
FIG. 8 is a graph showing a relationship between an etching time, a minimum bar and a hole depth in a conventional plasma etching method.

As described above, in accordance with the illustrative embodiment, in the overetching process, the first etching process and the second etching process are alternately performed plural times for the following reasons. For example, if the overetching process is subsequently performed after the main etching process under the same etching condition as that of the main etching process, a minimum bar (a thickness of a thinnest portion of a partition wall between adjacent holes) is decreased rapidly in the overetching process, as compared to the main etching process. Such a rapid decrease of the minimum bar is depicted in a graph of FIG. 8 in which a vertical axis represents the minimum bar and a hole depth, and a horizontal axis represents an etching time.

Such a rapid decrease of the minimum bar is deemed to be caused because the amount of fluorine ions, which has been consumed for the etching of the silicon dioxide layer 202 during the main etching process, becomes excessive in the overetching process and, thus, the fluorine ions serve to etch a sidewall portion of the hole 210. Here, in order to suppress the rapid decrease of the minimum bar, if the overetching process is performed under the above-mentioned etching condition where a great amount of deposits is generated, since the top opening diameter (Top CD) thereof is small, the hole 210 would be covered with the deposits.

For the above reasons, in accordance with the illustrative embodiment, in the overetching process, the first etching process having the etching condition where a great amount of deposits is generated and the second etching process having the etching condition where a small amount of deposits is generated are alternately performed plural times for a short period of time. Accordingly, the overetching process can be performed while forming the protection film 211. Thus, the decrease of the minimum bar in the overetching process can be suppressed, and the hole 210 can be prevented from being covered with deposits.

Here, by way of example, the main etching process may be switched to the overetching process based on a detection result of the end-point detector (EPD) 80 shown in FIG. 1. As shown in a graph of FIG. 6 in which a vertical axis represents emission intensity and a horizontal axis represents an etching time, emission intensity of light from nitride having a wavelength of about 387 nm is detected and a change of the detected emission intensity is measured. As can be seen from the graph of FIG. 6, when the silicon nitride layer 201 at the bottom of the silicon dioxide layer 202 is started to be exposed and the silicon nitride layer 201 begins to be etched, the emission intensity is started to increase. Accordingly, a point (just time) where emission intensity of light having a wavelength of about 387 nm is started to increase may serve as a switching point where the main etching process is switched to the overetching process.

Figure 6:
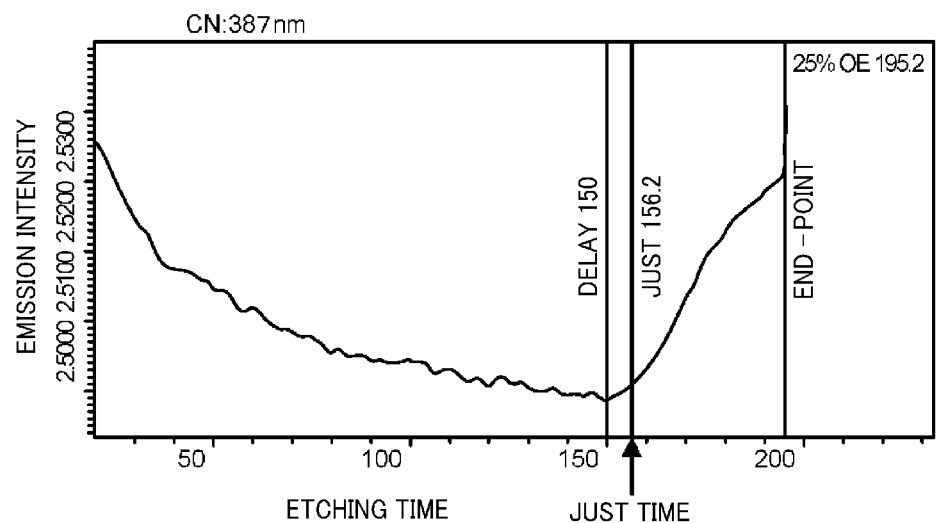
FIG. 6 is a graph showing an example of a signal waveform detected by an end-point detector (EPD)

The change in the emission intensity of light having a wavelength of about 387 nm in the graph of FIG. 6 is measured when the oxide film is etched under the following etching conditions.

Pressure: about 4.0 Pa (about 30 mTorr)
Processing gas: $C_4F_6/CF_4/Ar/O_2$=about 30 sccm/about 20 sccm/about 300 sccm/about 26 sccm
Additional gas supplied to periphery portion: $C_4F_8/O_2$=about 4 sccm/about 7 sccm
High frequency power (high frequency power/low frequency power): about 2300 W/about 4500 W
DC voltage: about −150 V
Gas flow rate ratio at central portion: about 50%

Figure 7:
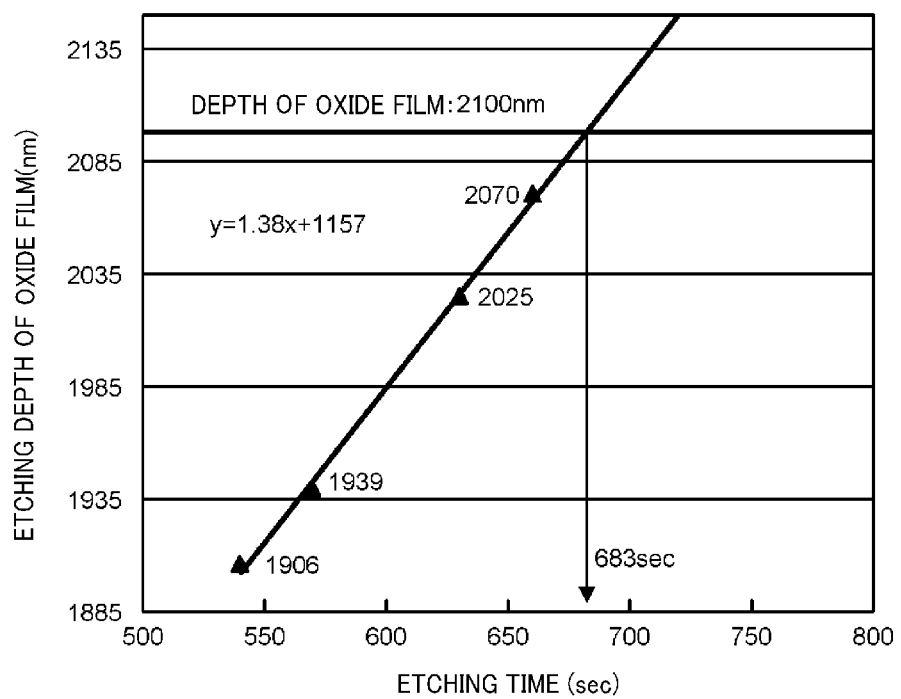
FIG. 7 is a graph showing an example of a relationship between an etching time and an etching depth.

Further, as depicted in FIG. 7 in which a vertical axis represents an etching depth of the oxide film and a horizontal axis represents an etching time, a relationship between the etching depth of the oxide film and the etching time has a substantially linear relationship (in an example of FIG. 7, y=1.38x+1157) under a same etching condition. Such a relationship can be previously observed at each etching time by conducting a cross section observation by a Scanning Electron Microscope (SEM). Then, the main etching process may be switched to the overetching process at an etching time when an etching depth of the oxide film reaches a certain etching depth. For example, as can be seen from FIG. 7, when a depth of the oxide film is about 2100 nm and an etching time of the oxide film is about 683 seconds, the etching process of the oxide film is finished. Accordingly, the main etching process may be switched to the overetching process at this timing.

As a first experimental example, the plasma etching process is performed on the silicon dioxide layer 202 by the plasma etching apparatus shown in FIG. 1 under the following etching conditions.

Figure 4:
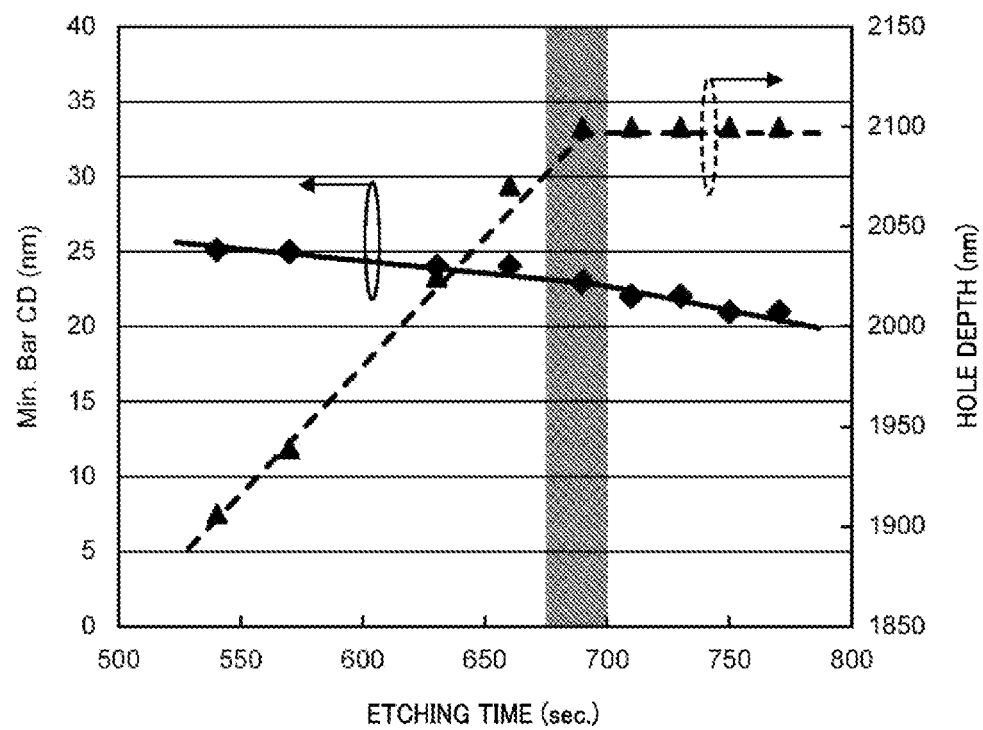
FIG. 4 is a graph showing a relationship between an etching time, a minimum bar and a hole depth in the plasma etching method in accordance with the illustrative embodiment.

(Main etching process)
Pressure: about 2.0 Pa (about 15 mTorr)
Processing gas: $C_4F_6/C_4F_8/Ar/O_2/CO$=about 37 sccm/about 33 sccm/about 300 sccm/about 40 sccm/about 180 sccm
Additional gas supplied to periphery portion: $C_4F_8/O_2$=about 5 sccm/about 5 sccm
High frequency power (high frequency power/low frequency power): about 2500 W/about 7800 W
DC voltage: about −150 V
Gas flow rate ratio at central portion: about 40%
(Overetching process)
(First etching process)
Pressure: about 2.0 Pa (about 15 mTorr)
Processing gas: $C_4F_6/Ar/O_2$=about 54 sccm/about 200 sccm/about 52 sccm
High frequency power (high frequency power/low frequency power): about 1000 W/about 6000 W
DC voltage: about −150 V
Gas flow rate ratio at central portion: about 40%
Etching time of one cycle: about 10 seconds
(Second etching process)
Pressure: about 2.0 Pa (about 15 mTorr)
Processing gas: $C_4F_8/Ar/O_2$=about 85 sccm/about 200 sccm/about 25 sccm
High frequency power (high frequency power/low frequency power): about 1000 W/about 6000 W
DC voltage: about −150 V
Gas flow rate ratio at central portion: about 40%
Etching time of one cycle: about 10 seconds A value of a minimum bar (a thickness of a thinnest portion of a partition wall between adjacent holes) and a value of a hole depth measured in the first experimental example are depicted in a graph of FIG. 4. In FIG. 4, a vertical axis represents the minimum bar and the hole depth, and a horizontal axis represents an etching time. As can be seen from the graph of FIG. 4, a rapid decrease of the minimum bar in the overetching process can be suppressed in the first experimental example.

Then, as a second experimental example, the plasma etching process is performed under the same processing conditions as those of the first experimental example excepting that, in the processing gas for the second etching process of the overetching process, $C_4F_8$ in the first experimental example is replaced with $C_3F_8$. As a result, a variation in the value of a minimum bar in the second experimental example is found to be substantially the same as that of the first experimental example.

Figure 5:
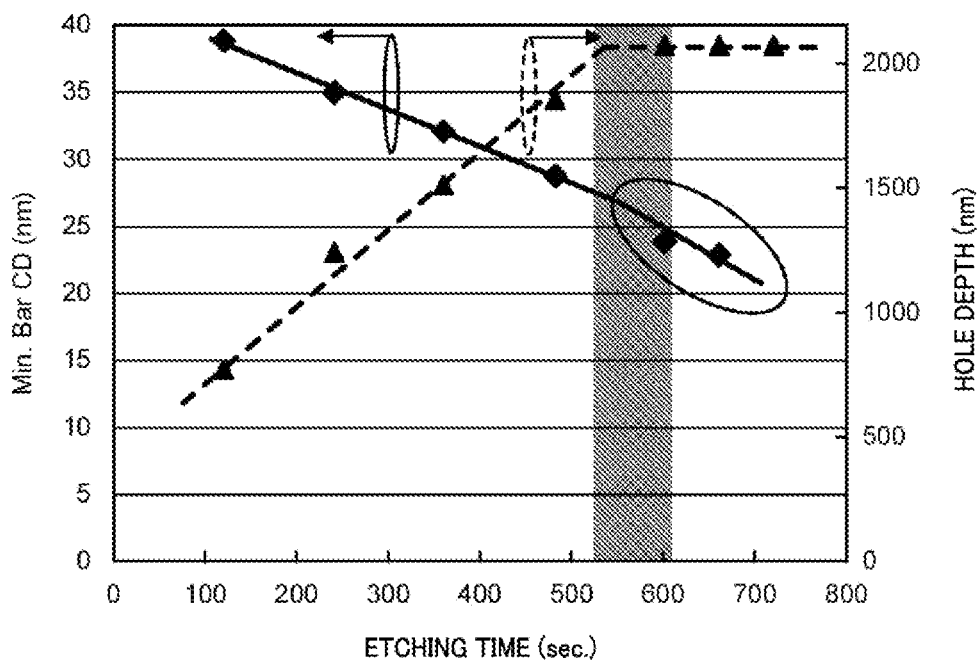
FIG. 5 is a graph showing a relationship between an etching time, a minimum bar and a hole depth in the plasma etching method in accordance with another illustrative embodiment.

Thereafter, as a third experimental example, a main etching process is performed under the same etching conditions as those of the overetching process in the first experimental example. That is, in the main etching process, the first etching process and the second etching process are performed multiple times, and, subsequently, an overetching process is performed in the same way. A value of a minimum bar (a thickness of a thinnest portion of a partition wall between adjacent holes) and a value of a hole depth measured in the third experimental example are depicted in a graph of FIG. 5. In FIG. 5, a vertical axis represents the minimum bar and the hole depth, and a horizontal axis represents an etching time. As can be seen from the graph of FIG. 5, a rapid decrease of the minimum bar can also be prevented in this third experimental example.

In accordance with the illustrative embodiments and experimental examples as discussed above, it is possible to provide a semiconductor device manufacturing method and a plasma etching method capable of forming a contact hole having a high aspect ratio while suppressing a rapid decrease of a minimum bar in an overetching process. The present disclosure is not limited to the illustrative embodiments and experimental examples described above, and various changes and modifications may be made.

What is claimed is:

1. A plasma etching method for forming, via a mask layer, a hole in a silicon dioxide film formed on an etching stopper layer of a processing target substrate accommodated in a processing chamber by using plasma generated from a processing gas introduced into the processing chamber, the method comprising:
    a main etching process for etching the silicon dioxide film using, as the processing gas, a gaseous mixture including $C_4F_6$ gas, $C_4F_8$ gas, Ar gas, $O_2$ gas and CO gas, wherein the main etching process is stopped upon exposing at least a part of the etching stopper layer; and
    a cyclic etching process that is started after at least the part of the etching stopper layer is exposed and after the main etching process is stopped,
    wherein the cyclic etching process that is started after at least the part of the etching stopper layer is exposed includes:
        a first etching process using a gaseous mixture of a $C_4F_6$ gas, an Ar gas and an $O_2$ gas as the processing gas; and
        a second etching process using a gaseous mixture of a $C_4F_8$ gas, an Ar gas and an $O_2$ gas as the processing gas, and the first etching process and the second etching process are alternately performed plural times.

2. The plasma etching method of claim 1, wherein a time during which each of the first etching process and the second etching process is performed one time is in a range from about 3 seconds to about 15 seconds.

3. The plasma etching method of claim 1, wherein the etching stopper layer is made of silicon nitride.

4. The plasma etching method of claim 1, wherein the mask layer is made of polysilicon.

5. A semiconductor device manufacturing method comprising:

a plasma etching process for forming, via a mask layer, a hole in a silicon dioxide film formed on an etching stopper layer of a processing target substrate accommodated in a processing chamber by using plasma generated from a processing gas introduced into the processing chamber, wherein the plasma etching process includes:

a main etching process for etching the silicon dioxide film using, as the processing gas, a gaseous mixture including $C_4F_6$ gas, $C_4F_8$ gas, Ar gas, $O_2$ gas and CO gas, wherein the main etching process is stopped upon exposing at least a part of the etching stopper layer; and a cyclic etching process that is started after at least the part of the etching stopper layer is exposed and after the main etching process is stopped, wherein the cyclic etching process that is started after at least the part of the etching stopper layer is exposed includes:

a first etching process using a gaseous mixture of a $C_4F_6$ gas, an Ar gas and an $O_2$ gas as the processing gas; and a second etching process using a gaseous mixture of a $C_4F_8$ gas, an Ar gas and an $O_2$ gas as the processing gas, and the first etching process and the second etching process are alternately performed plural times.

6. The semiconductor device manufacturing method of claim 5, wherein a time during which each of the first etching process and the second etching process is performed one time in a range from about 3 seconds to about 15 seconds.

7. The semiconductor device manufacturing method of claim 5, wherein the etching stopper layer is made of silicon nitride.

8. The semiconductor device manufacturing method of claim 5, wherein the mask layer is made of polysilicon.

* * * * *